United States Patent [19]
Barbu

[11] Patent Number: 5,142,245
[45] Date of Patent: Aug. 25, 1992

[54] POWER AMPLIFIER FOR RECTANGULAR INPUT SIGNALS

[75] Inventor: Stéphane Barbu, Caen, France

[73] Assignee: U.S. Philips Corporation, New York, N.Y.

[21] Appl. No.: 685,267

[22] Filed: Apr. 12, 1991

[30] Foreign Application Priority Data

Apr. 19, 1990 [FR] France ............................... 90 05010

[51] Int. Cl.[5] ......................... H03F 3/45; H03F 3/21; H03K 17/60
[52] U.S. Cl. .................................... 330/255; 307/254; 330/262
[58] Field of Search ................ 330/255, 262; 307/254, 307/262, 454, 455, 480

[56] References Cited

U.S. PATENT DOCUMENTS 3,531,660 9/1970 Engberg ..................... 307/254 X

Primary Examiner—James B. Mullins
Attorney, Agent, or Firm—Bernard Franzblau

[57] ABSTRACT

A power-amplifier cell which comprises an inverting input amplifier made up of a first transistor ($T_1$) having a collector connected to a first supply-voltage terminal via a first resistor ($R_{11}$), and an output stage comprising a second ($T_4$) and a third ($T_6$) transistor whose collector-emitter paths are arranged in series. The common point between the second and third transistors forms an output (5) of the power amplifier. The second transistor ($T_4$) has its base connected to the collector of the first transistor ($T_1$) and a control signal is applied to the base of the third transistor ($T_6$) via a second resistor ($R_{16}$). Furthermore, a first capacitor ($C_1$) is arranged in parallel with the first resistor ($R_{11}$) and the control signal is the input signal (E) or a fraction thereof. The power amplifier may comprise two cells whose first transistors ($T_1$) have their emitters coupled to one another.

26 Claims, 3 Drawing Sheets

POWER AMPLIFIER FOR RECTANGULAR INPUT SIGNALS

BACKGROUND OF THE DISCLOSURE

This invention relates to a power-amplifier cell which comprises an inverting input amplifier comprising a first transistor having a collector connected to a first supply-voltage terminal via a first resistor, and an output stage comprising a second and a third transistor whose collector-emitter paths are arranged in series, their common point forming an output of the power amplifier, the second transistor having its base connected to the collector of the first transistor, and means for applying to the base of the third transistor a control signal in phase with an input signal applied to the base of the first transistor.

Such an amplifier is known from U.S. Pat. No. 3,564,281 (FIG. 7b), which relates to a fast logic inverter, and from the article "A Wide-Band Class AB Monolithic Power Amplifier" by William D. Mack in the IEEE Journal of Solid State Circuits, Vol. 24, no. 1, Feb. 1989.

U.S. Pat. No. 3,564,281 describes a logic circuit which is used for switching but not as an amplifier. The amplifier described in the above article has been designed for use with sinusoidal signals and with a substantially resistive load.

SUMMARY OF THE INVENTION

It is an objective of the invention to provide a power amplifier capable of operating with rectangular input signals (for example, clock signals) and with a capacitive impedance. These two requirements, which are only met separately in the two above-mentioned documents, are particularly critical because they involve the rapid switching of comparatively large currents.

The basic idea of the invention is to realize the desired function while maintaining a minimal signal path. To achieve this, switching is accelerated in the inverting input amplifier so as to optimize the rise time in the branch comprising the inverting input amplifier in series with the second transistor, and the third transistor is driven directly by the input signal, in switching time being adapted to correspond to that of said branch.

A power-amplifier cell in accordance with the invention is characterized in that it comprises a first capacitor arranged in parallel with the first resistor, in that the control signal is the input signal multiplied by a coefficient smaller than or equal to 1, and in that said means for applying a control signal comprise a second resistor arranged in series with the base of the third transistor.

The second transistor and a first voltage source coupled to the first supply-voltage terminal enable the capacitive impedance to be charged and discharged respectively. Surprisingly, the first capacitor enables the switching speed of the first transistor to be raised and the second resistor enables the switching time of the third transistor to be adapted so as to synchronize switching of the second and the third transistor.

The cell may comprise a voltage divider adapted to receive a signal from an input source and to generate the input signal and the control signal. Thus, the amplitudes of the signals on the bases of the first and the third transistor can be adapted, in particular so as to avoid hard switching of these transistors, yielding an improved response time.

The cell may comprise a parallel resistor-capacitor network arranged in the emitter of the third transistor and having a time constant preferably equal to the product of the value of the first resistor and that of the first capacitor.

The invention also relates to a differential power amplifier comprising two power-amplifier cells as defined above, the first transistors of both cells being coupled to one another by their emitters.

In an advantageous embodiment the third transistors have a third resistor connected between their emitters. This has the advantage that the linear range of the differential stage comprising the third transistors can be adjusted. A first and a second current source may be connected to the respective emitters of the third transistors of both cells.

In a modification a fourth and a fifth resistor are connected in series between the emitters of the third transistors, and a third current source (serving as said first and second current sources) is connected to the node between the fourth and the fifth resistor.

A third capacitor may be connected between the emitters of the third transistors.

This capacitor is seen as an inductance in the collectors of the third transistors, which explain the increased pass band.

In a preferred embodiment a sixth and a seventh resistor can be respectively arranged in series with the collector-emitter path of the second and the third transistor of each cell. They can provide a decoupling between the collectors of the third transistors and the capacitive load of the outputs so as to preclude ripple on the transients.

An eighth resistor may be connected between the bases of the first transistors of both cells.

In the case where the voltage level is to be shifted, a diode-connected transistor poled in the forward direction is arranged between a node of the first resistors of the two cells and the first apply voltage terminal, and a fourth capacitor may then be arranged between said node and a second supply terminal source. The fourth capacitor creates a virtual ground point and provides common-mode rejection, while compensating for the self-induction effect caused by the diodes.

BRIEF DESCRIPTION OF THE DRAWINGS

The invention will be more fully understood by reading the following description, given by way of non-limitative example, with reference to the accompanying drawings, in which.

DESCRIPTION OF THE PREFERRED EMBODIMENTS

Figure 1A:
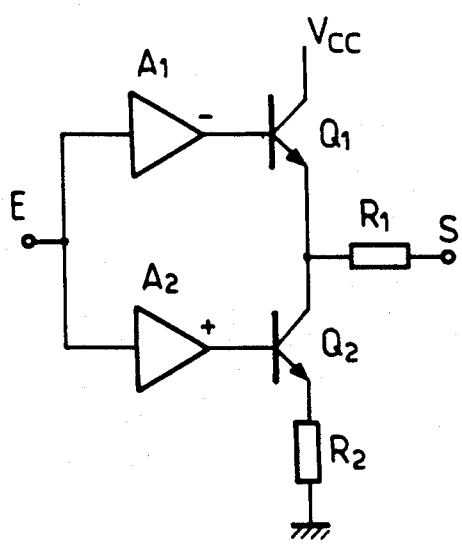
FIGS. 1a and 1b shows a class AB amplifier in accordance with the cited prior art.

FIG. 1a shows a prior-art amplifier which is a modification of the "totem pole" circuit as described in, for example, the publication by P. R. Gray and R. G. Meyer, "Analysis and Design of Analog Intergrated Circuits", 2nd edition, John Wiley, New York, 1984. A transistor $Q_1$ having its base connected to the output of an inverter $A_1$, whose input receives an input signal E, drives an output S via an output resistor $R_1$. For output signals S of positive amplitude a transistor $Q_2$ having its base connected to the output of a non-inverting amplifier $A_2$, whose input receives the input signal $E_1$, is cut off completely. For negative signals at the output the transistor $Q_2$ is turned on to allow the passage of current without the transistor $Q_1$ being cut off, which enables the transfer function to be maintained ($Q_1$ operates at a lower current level).

Figure 1B:
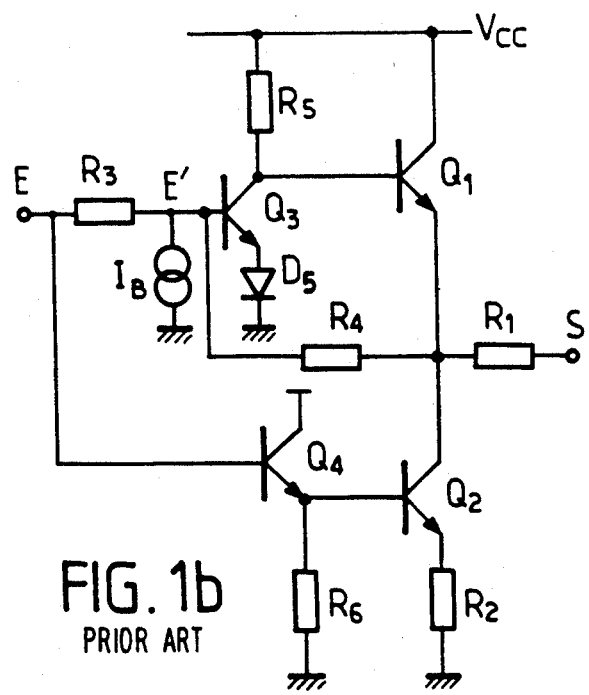

FIG. 1b shows a modification of the amplifier shown in FIG. 1a. The amplifier $A_1$ comprises a transistor $Q_3$ having its base coupled to an input resistor $R_3$ and having its collector connected to the base of the transistor $Q_1$. A feedback resistor $R_4$ is arranged between the emitter of the transistor $Q_1$ and the base of the transistor $Q_3$.

A diode $D_5$, poled in the forward direction in the emitter of the transistor $Q_3$, shifts the bias of this transistor by one base-emitter voltage $V_{be}$ and enables the emitter follower (transistor $Q_4$) forming the amplifier $A_2$ to operate at negative voltages S. A bias current source $I_B$ connected to the base of $Q_3$ determines the bias voltage on the emitter of $Q_1$.

Figure 2:
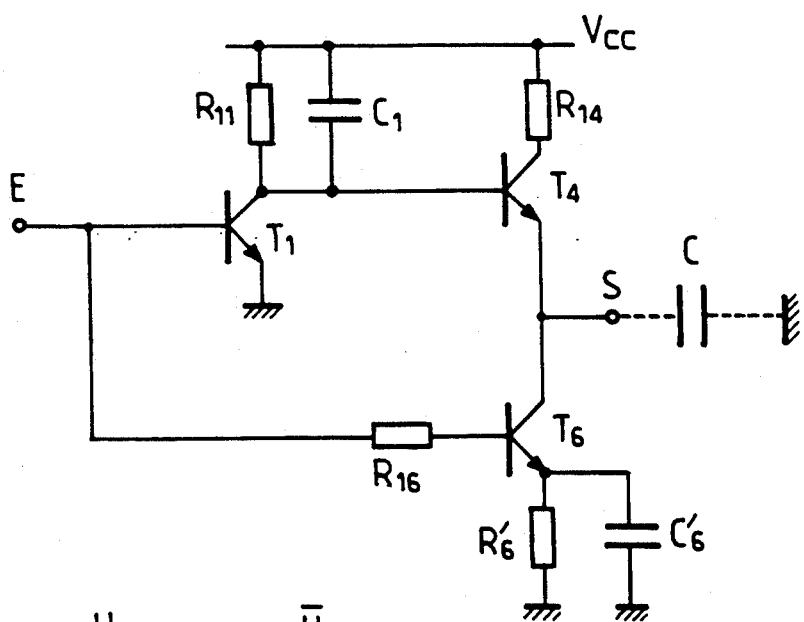
FIG. 2 shows a power-amplifier cell in accordance with the invention.

The module shown in FIG. 2 is also of the "totem pole" type but the operating conditions are different.

It has the following similarities with the prior-art circuit of U.S. Pat. No. 3,564,281 (FIG. 7b). A transistor $T_1$ is loaded by a resistor $R_{11}$ at its collector. Two transistors $T_4$ and $T_6$ have their collector-emitter paths arranged in series like the transistors $Q_1$ and $Q_2$, the transistor $T_4$ having a resistor $R_{14}$ in its collector circuit. Moreover, there is a connection between the base of the transistor $T_1$ and the base of the transistor $T_6$.

The circuit shown in FIG. 2 differs from that in FIG. 7b of the prior-art document U.S. Pat. No. 3,564,281 in the following points:

for faster switching, which is favourable for the desired operation with rectangular signals, a capacitor $C_1$ is arranged in parallel with the resistor $R_{11}$, which in a surprising manner improves the transient response (dynamic compensation effect).

to ensure that the transistor $T_4$, whose base is connected to the collector of the transistor $T_1$ and whose collector-emitter path is arranged in series with that of the transistor $T_6$, is switched in synchronism with the transistor $T_6$ a resistor $R_{16}$ is arranged in series in the base of $T_6$. The resistor $R_{16}$ (whose value is determined by experiment on the basis of the signal waveforms) delays the change-over of the transistor $T_6$ in such a way that this transistor is switched substantially in synchronism with the switching of the transistor $T_1$ (accelerated by $C_1$) and of the transistor $T_4$. This results in a minimum number of circuit elements and a signal path which is as short as possible, which is favourable for switching rectangular signals such as clock signals, in particular in the case of a substantially capacitive load C.

It is very favourable if the signals E on the base of the transistor $T_1$ have such a low level that the transistors $T_1$ and $T_6$ are not cut off, and such a high level that the transistors $T_1$ and $T_6$ are not bottomed. This would result in optimum conditions for fast switching.

When the input signal E has its low level $T_1$ is cut off (preferably not completely), the transistor $T_4$ is on and the transistor $T_6$ is off (or preferably operates with a small current). The capacitor C is charged via the collector-emitter path of the transistor $T_4$. A resistor $R_{14}$ may be arranged in the collector of $T_4$. When the input signal E has its high level $T_4$ is cut off (preferably not completely) and the transistor $T_6$ is turned on. The capacitor C discharges via the collector-emitter path of the transistor $T_6$. A resistor $R'_6$ may be arranged between the emitter of the transistor $T_6$ and the common-mode terminal. A capacitor $C'_6$ whose function will be explained hereinafter, may be arranged in parallel with the resistor $R'_6$.

Figure 3:
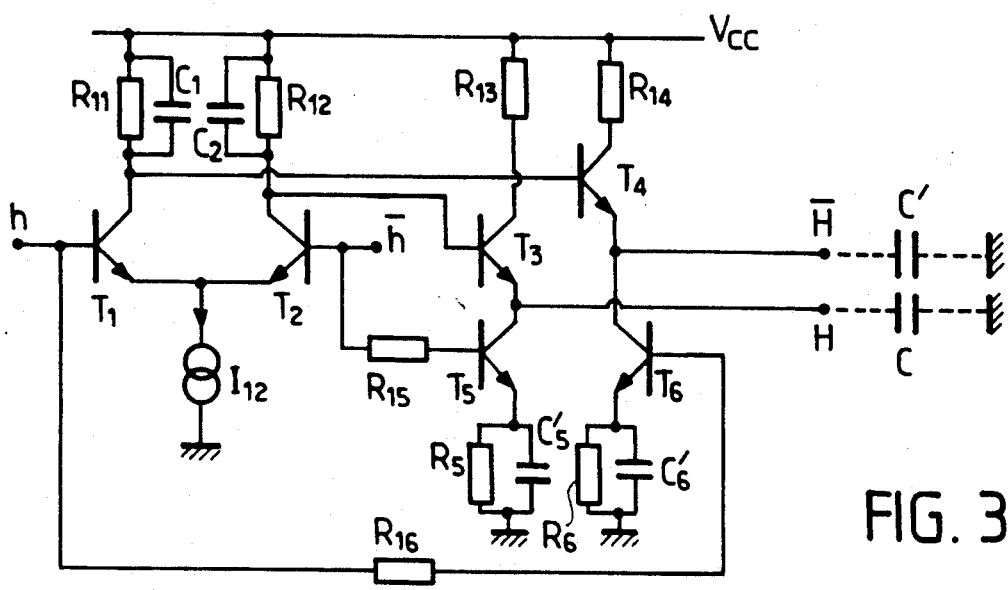
FIG. 3 shows a power amplifier in accordance with the invention.

FIG. 3 shows a differential amplifier in accordance with the invention comprising two cells as shown in FIG. 2 The elements $T_1$, $T_4$, $T_6$, $R_{11}$, $R_{14}$, $R_{16}$, $R'_6C_1$ and $C'_6$ of the first cell bear the references $T_2$, $T_3T_5$, $R_{12}$, $R_{13}$, $R_{15}$, $R'_5$, $C_2$ and $C'_5$ in the second cell. The transistors $T_1$ and $T_2$ have their emitters coupled to form a differential stage, and a current source $I_{12}$ is connected to these coupled emitters. The base of $T_1$ receives a clock signal h and the base of $T_2$ receives its logic inverse $\bar{h}$. The output H, which is in phase with h except for the response time, is formed by the emitter of the transistor $T_3$. The output $\bar{H}$, which is in phase with $\bar{h}$ except for the response time, is formed by the emitter of the transistor $T_4$. The outputs H and $\bar{H}$ are adapted to be loaded by substantially capacitive impedances C and C' respectively.

Figure 4:
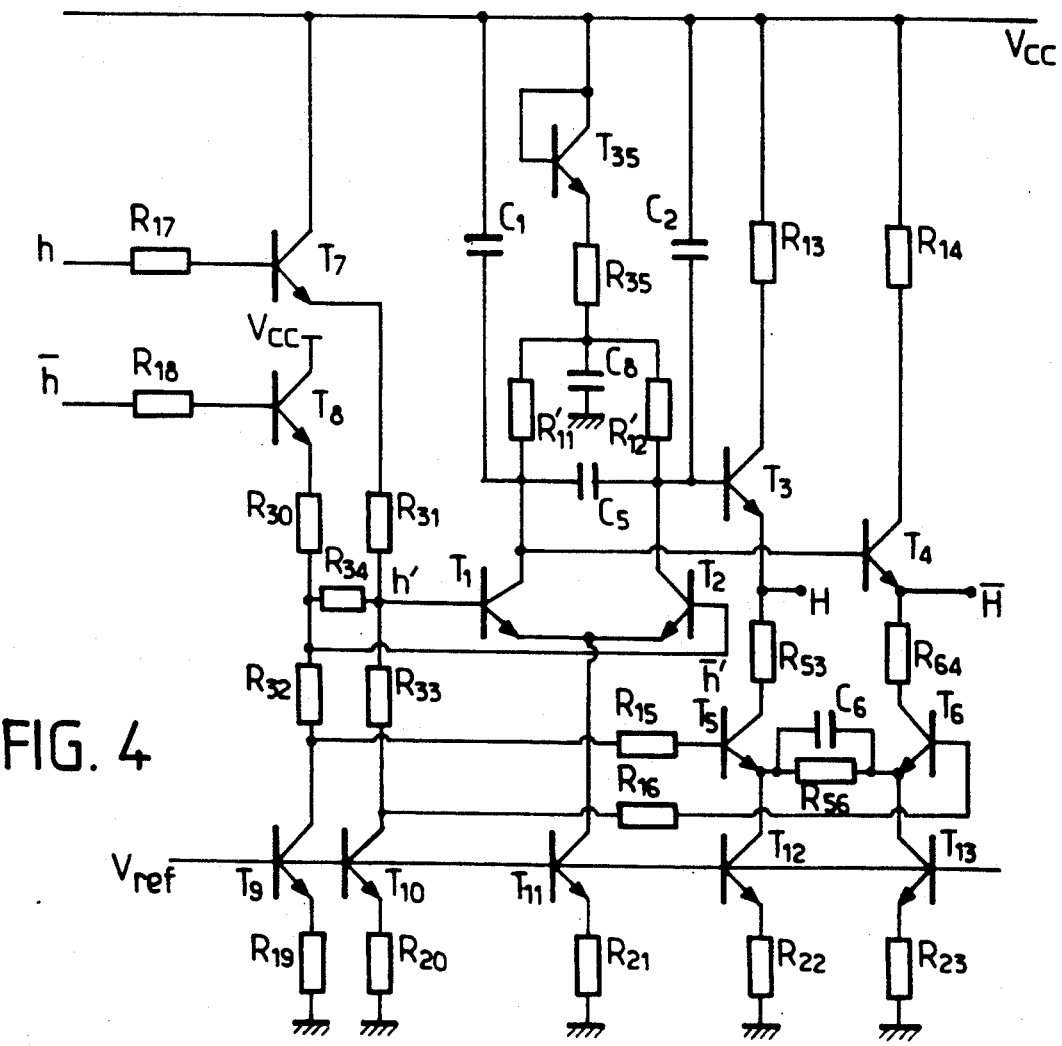
FIG. 4 shows a power amplifier in accordance with a preferred embodiment of the invention.

In FIG. 4 elements corresponding to those in FIG. 3 bear the same references. The current source $I_{12}$ is formed by a transistor $T_{11}$ and an emitter resistor $R_{21}$, and the base of $T_{11}$ receives a reference voltage $V_{REF}$. Current sources connected to the emitters of $T_5$ and $T_6$ respectively are formed by the transistors $T_{12}$ and $T_{13}$, which have emitter resistors $R_{22}$ and $R_{23}$ respectively and whose bases receive a reference voltage $V_{REF}$. By means of the dimensions of the transistors $T_{11}$, $T_{12}$ and $T_{13}$ and the resistors $R_{21}$, $R_{22}$ and $R_{23}$ the various values of the currents in the collectors of these transistors can be determined.

The circuit shown in FIG. 4 has certain improvements in comparison with that shown in FIG. 3 and can be combined or used separately.

First of all the clock signals h and $\bar{h}$ are applied to the inputs of two voltage dividers comprising the emitter-follower transistors $T_7$ and $T_8$ respectively (with base resistors $R_{17}$ and $R_{18}$, respectively). The emitter of $T_7$ is connected to a first voltage-divider branch comprising a series arrangement of two resistors $R_{31}$ and $R_{33}$ and a current source ($T_{10}$, $R_{20}$, $V_{REF}$). The emitter of $T_8$ is connected to a second voltage-divider branch comprising two resistors $R_{30}$ and $R_{32}$ and a current source ($T_9$, $R_{19}$, $V_{REF}$). The node between the resistors $R_{31}$ and $R_{33}$ is connected to the base of transistor $T_1$. The node between the two resistors $R_{30}$ and $R_{32}$ is connected to the base of $T_2$. The node between the resistor $R_{33}$ and the current source ($T_{10}$, $R_{20}$, $V_{REF}$), i.e, the collector of $T_{10}$, drives the base of $T_6$ via the resistor $R_{16}$. The node between the resistor $R_{32}$ and the current source ($T_9$, $R_{19}$, $V_{REF}$), i.e. the collector of $T_9$, drives the base of $T_5$ via the resistor $R_{15}$.

The two said nodes, connected to the bases of the transistors $T_1$ and $T_2$ respectively, are interconnected by a resistor $R_{34}$. If $R_{30}$ and $R_{31}$ have the same value this yields the following relationship (if the base voltages of the transistors $T_1$ and $T_2$ are designated $h'$ and $\bar{h}'$ respectively);

$$h' - \bar{h}' \frac{R_{34}}{R_{30}} \quad \frac{1}{1 + R_{34}/R_{30}} (h - \bar{h})$$

The resistors $R_{32}$ and $R_{33}$ serve to reduce the voltage, if necessary; in order to drive the base of $T_5$ and $T_6$ without these transistors being saturated. Allowance is to be made for the values of these resistors in series with $R_{15}$ and $R_{16}$ respectively in the calculation of the switching delay of $T_5$ and $T_6$ provided by the last-mentioned resistors.

By way of an alternative, a resistive divider bridge may be used for each of the cells.

By means of a capacitor $C_5$ arranged between the collectors of the transistors $T_1$ and $T_2$ current surges on the collectors of these transistors can be avoided. The value of this capacitor should be as a small as possible, allowance being made for a satisfactory attenuation of current surges (for example, 5 pF).

The resistors $R_{11}$ and $R_{12}$ may be connected to the supply-voltage source $V_{cc}$, a voltage shift being provided by a diode-connected transistor $T_{35}$. FIG. 4 shows two resistors $R'_{11}$ and $R'_{12}$ having one terminal interconnected and arranged in series with a resistor $R_{35}$ and the diode-connected transistor $T_{35}$. A capacitor $C_8$ is arranged between the node of the resistors $R'_{11}$ and $R'_{12}$ and ground (or a second supply-voltage source) creates a virtual ground for the purpose of common-mode rejection $C_8$ may be also be small (for example, 20 pF), but is preferably large enough to compensate for the self-induction effect of $T_{35}$. For example, it is possible to select $R_{35}C_8 \approx 10 \, t_f$ ($t_f$ = rise time of the stage $T_1$, $T_2$), which provides a correction for harmonics.

A resistor $R_{56}$ arranged between the emitters of $T_5$ and $T_6$ serves to ensure that the transistors $T_5$ and $T_6$ operate as a differential stage whose linear range can be selected by adjusting the value of $R_{65}$.

Thus, switching can be adjusted in such a way (dynamic linearization) that alternately a maximum or a minimum current flows in the transistors $T_5$ and $T_6$, depending on the instantaneous sign of the clock voltage. For linear operation it is necessary that:

$$R_{56} I > \Delta V + V_T$$

I : current of the current sources comprising the transistors $T_{12}$ and $T_{13}$
$\Delta V$ : maximum amplitude of the signals on the bases of the transistors $T_5$ and $T_6$
$V_T = 26$ mV.

$R_{56}$ I can be adjusted to have a ratio K between the maximum and minimum currents of the order of 10.

A capacitor $C_6$ in parallel with the resistor $R_{56}$ enables the switching speed to be increased. The capacitor $C_6$ is seen as a self-inductance from the collectors of the transistors $T_5$ and $T_6$.

Finally, resistors $R_{53}$ and $R_{64}$ connected between the emitter of $T_3$ and the collector of $T_5$ and between the emitter of $T_4$ and the collector of $T_6$, respectively, enable the collectors of $T_5$ and $T_6$ to be decoupled from the capacitive loads C and C' to avoid ripple on the high and low levels of the output signals. Their values should also be as small as possible to achieve the desired effect.

Figure 5:
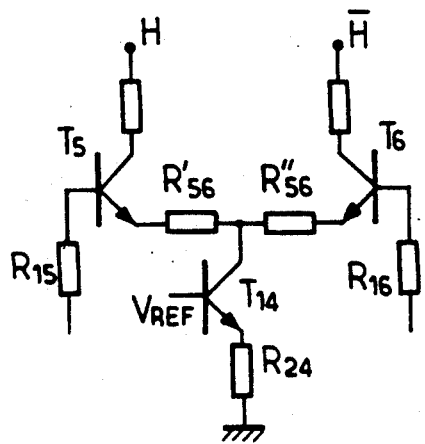
FIG. 5 shows a modification of the differential switching stage at the output.

FIG. 5 shows a modification of the differential stage comprising the transistors $T_5$ and $T_6$. Their emitters are interconnected by two resistors $R'_{56}$ and $R''_{56}$ in series. The node between these two resistors is connected to a current source ($T_{14}$, $R_{24}$, $V_{REF}$).

Figure 6A:
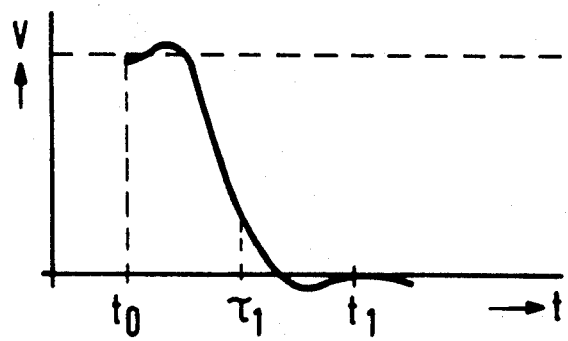
FIGS. 6a and 6b show the switching on the emitter of $T_4$ via $T_1$ with and without the capacitor $C_1$ respectively.
Figure 6B:
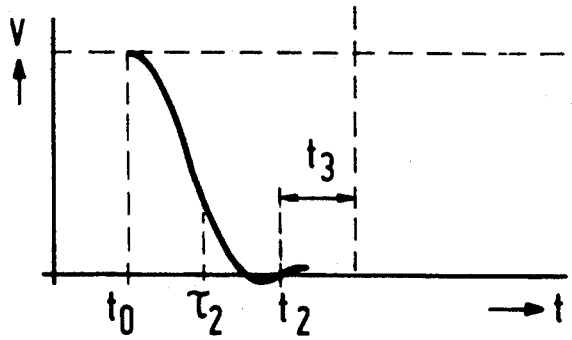

FIGS. 6a and 6b illustrate the influence of the capacitor $C_1$ on the switching process of the transistor $T_1$. In the absence of the capacitor $C_1$ (FIG. 6a) the response is wholly stabilized at the instant $t_1$ (corresponding to a response time $\tau_1$). Owing to the capacitor $C_1$ (FIG. 6b) the response is more rapid and stabilizes sooner at the instant $t_2$ (response time $\tau_2 < \tau_1$). This yields a gain in time $t_3$ to obtain a fully stabilized response. The value of the capacitor $C_1$ is adjusted by experiment so as to obtain the shortest response time $\tau_2$. A response time $\tau_2$ of a few ns (for example, approximately 2 ns) has been obtained with a transistor of a given type by choosing $R_{11}32$ 200 $\Omega$ and $C_1 = 2$ pF, i.e. $R_{11}C_{1}32$ 0.4 ns. In the present case this corresponds to a time constant smaller than the response time, which value can be optimized in practice.

Figure 7A:
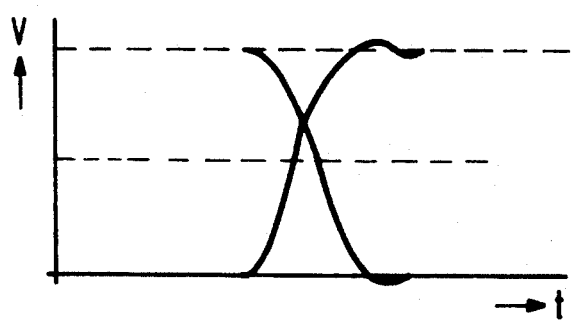
FIGS. 7a and 7b show the switching signals on the emitter of $T_4$ (cross-over) with and without the capacitor $C'_6$ respectively.
Figure 7B:
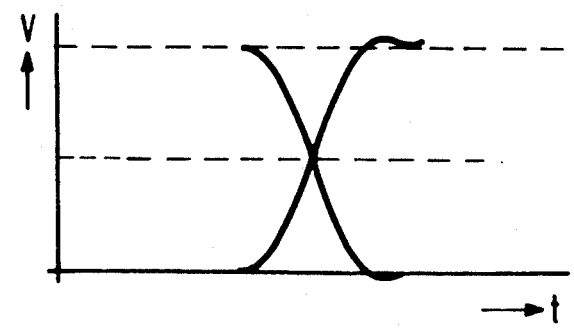

FIGS. 7a and 7b illustrate the effect of the capacitor $c'_6$ in parallel with the resistor $R'_6$. The object is to obtain the same impedance in the collector of the transistor $T_6$ and to achieve a symmetrical operation of the cell shown in FIG. 2 on the rising and falling edges, i.e. a cross-over in the centre of the voltage excursion.

This optimum operation is generally achieved when $R_{11}C_1 = R'_6C'_6$ (FIG. 7b), FIG. 7a showing the incorrect cross-over (and hence a faulty symmetry) in the absence of compensation.

Below, more precise guidelines will be given to allow the most favourable values to be calculated for at least some of the parts.

From the emitter of $T_4$ the parallel network $R_{11} C_1$ is seen as a self-inductance $L'$ in series with a resistance $R'$.

$$L' = \frac{\tau_n t_f^2}{\tau^2 \pi^2} R_{11}$$

$$R' = \frac{\tau_n}{C_1}$$

where
$\tau = R_{11} C_1$,
$\tau_n$ = transit time in the base of a transistor,
$t_f$: rise time of the signal on the base of $T_4$.

The parallel network $R'_6 C'_6$ from the collector of $T_6$ is seen as a self-inductance $L''$ in series with a resistance $R'$.

$'' = R_c R'_6 C'_6$ $R'' = R_c$ where: $R_c$ is the intrinsic collector resistance of $T_6$ (if applicable, in series with $R_{64}$).

The transistors $T_4$ and $T_6$ are in the same switching state if $L' = L''$ and $R' = R''$.

If the choice $$\pi \frac{1}{t_f} \approx 1$$

is made this yields the approximation:

$$R_cR'_6C_6 = \tau_n R_{11}$$

$$C_cC_1 = \tau_n$$

so that:

$$R_{11}C_1 = R'_6C_6 \approx \frac{t_f}{\pi}$$

For FIG. 4 this yields:

$$R_{11}C_1 = R_{56}C_6 = \frac{t_f}{\pi}$$

In practice the rise time of the transistor $T_1$ may be chosen for $t_f$.

Example:

$$R_{11} \approx 200\Omega, C_1 = 2 \text{ pF}$$

$$R_{56} = 600\Omega, C_6 \approx 0.75 \text{ pF}.$$

Moreover, it is necessary that $R_{11} I_{12} > \Delta V$,

To obtain a rapid discharge of C, the following choice is to be made:

$$I_{12} = I_{13} > \frac{C\Delta V}{t}$$

t = the desired discharge time for the capacitor C.

I claim:

1. A power-amplifier cell which comprises an inverting input amplifier comprising a first transistor having a collector connected to a first supply-voltage terminal via a first resistor, an output stage comprising a second and a third transistor whose collector-emitter paths are connected in series, their common point forming an output of the power amplifier, the second transistor having its base connected to the collector of the first transistor, and means for applying to the base of the third transistor a control signal in phase with an input signal applied to the base of the first transistor, characterized in that a first capacitor is coupled in parallel with the first resistor, in that the control signal is the input signal multiplied by a coefficient less than or equal to 1, and in that said control signal applying means comprise a second resistor connected in series with the base of the third transistor.

2. A power-amplifier cell as claimed in claim 1, which further comprises a voltage divider adapted to receive a signal from an input source and to generate the signal and the control signal.

3. A power-amplifier cell as claimed in claim 1, wherein the product of the values of the first resistor and of the first capacitor is smaller than the rise time ($\tau_2$) of said cell.

4. A power-amplifier cell as claimed in claim 3, which further it comprises a parallel resistor-capacitor network connected in series with the emitter of the third transistor.

5. A power-amplifier cell as claimed in claim 4, wherein the time constant of said parallel network is substantially equal to the product of the values of the first resistor and of the first capacitor.

6. A differential power amplifier comprising first and second power-amplifier cells each as claimed in claim 3 wherein the first transistors of each cell have their emitters coupled to one another.

7. A differential power amplifier comprising first and second power-amplifier cells each as claimed in claim 1 wherein emitters of the first transistors of each cell are coupled to one another.

8. A differential power-amplifier as claimed in claim 7, wherein the third transistors of the first and second power-amplifier cells have a third resistor connected between their emitters.

9. A differential power-amplifier as claimed in claim 8, wherein further comprises a first and a second current source connected to the emitter of each respective one of the third transistors.

10. A differential power-amplifier as claimed in claim 9, which further comprises a second capacitor coupled between the emitters of said third transistors.

11. A differential power-amplifier as claimed in claim 10, wherein the product of the values of the first resistor and of the first capacitor is substantially equal to the product of the values of the third resistor and of the second capacitor.

12. A differential power-amplifier as claimed in claim 9 which further comprises a fourth resistor connected between the bases of the first transistors of the first and second cells.

13. A differential power-amplifier as claimed in claim 8, which further comprises a fourth and a fifth resistor connected in series with the collector-emitter paths of the second and the third transistors of the first and second cells, respectively.

14. A differential power-amplifier as claimed in claim 8 which further comprises a diode-connected transistor connected between a common node of the first resistors of the first and second cells and the first supply voltage terminal, and wherein the first capacitors of the first and second cells are each connected in parallel with a series combination of its respective first resistor and the diode-connected transistor.

15. A differential power-amplifier as claimed in claim 7, which further comprises a third and a fourth resistor connected in series between the emitters of the third transistors and a current source connected to a node between the third and the fourth resistor.

16. A differential power-amplifier as claimed in claim 7, which further comprises a third resistor connected between the bases of the first transistors of the first and second cells.

17. A differential power-amplifier as claimed in claim 7, which further comprises a diode-connected transistor poled in the forward direction and connected between a common node of the first resistors of the first and second cells and the first supply voltage terminal.

18. A differential power-amplifier as claimed in claim 17, which further comprises a second capacitor coupled between said common node of the first resistors and a second supply-voltage terminal.

19. A power-amplifier cell as claimed in claim 1, which further comprises a parallel resistor-capacitor network connected in series with the emitter of the third transistor.

20. A power-amplifier cell as claimed in claim 19, wherein the RC time constant of said parallel resistor-capacitor network is substantially equal to the product of the resistance of the first resistor and the capacitance of the first capacitor.

21. A power-amplifier cell as claimed in claim 19 wherein the parallel resistor-capacitor network is connected to a second terminal of said supply-voltage and said first capacitor is coupled in parallel with the first resistor via a current path exclusive of said supply-voltage.

22. A power-amplifier circuit for rectangular signals comprising:

an input terminal for supplying the rectangular signals to the power-amplifier, a first resistor and a first capacitor connected in a parallel RC circuit, means connecting said parallel RC circuit in a first series circuit with a first switching transistor to terminals of a DC voltage supply for the power-amplifier, second and third switching transistors connected in a second series circuit to the terminals of the DC voltage supply, means coupling a control electrode of the first switching transistor to said input terminal, a second resistor coupling a control electrode of the third switching transistor to said input terminal and with the resistance value of the second resistor chosen so that the switching of the second and third transistors is synchronized, means connecting a control electrode of the second transistor to a junction point between the first switching transistor and the parallel RC circuit, and an output terminal of the power-amplifier coupled to a second junction point between the second and third switching transistors.

23. A power-amplifier circuit as claimed in claim 22 wherein said output terminal is adapted for connection to a capacitive load, and the RC time constant of the parallel RC circuit is shorter than the rise time of the power-amplifier.

24. A power-amplifier circuit as claimed in claim 22 further comprising;

a second parallel resistor-capacitor circuit connected in series with the third switching transistor and having an RC time constant related to the RC time constant of the first parallel resistor-capacitor circuit.

25. A differential power-amplifier comprising first and second power-amplifier circuits each as claimed in claim 22 wherein one main electrode of the first switching transistor of the first power-amplifier circuit and a corresponding one main electrode of a first switching transistor of the second power-amplifier circuit are connected to one another and via a current source to one terminal of the DC voltage supply, said differential power-amplifier further comprising a second input terminal coupled to a control electrode of the first switching transistor of the second power-amplifier circuit.

26. A differential power-amplifier as claimed in claim 25 further comprising a third resistor coupled between one main electrode of the third switching transistor of the first power-amplifier circuit and a corresponding one main electrode of the third switching transistor of the second power-amplifier circuit.

* * * * *